(12) United States Patent
Baba et al.

(10) Patent No.: US 9,036,356 B2
(45) Date of Patent: May 19, 2015

(54) PRINTED CIRCUIT BOARD LAMINATE

(71) Applicant: SUMITOMO WIRING SYSTEMS, LTD., Yokkaichi (JP)

(72) Inventors: Akira Baba, Yokkaichi (JP); Tatsuya Oka, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 5 days.

(21) Appl. No.: 13/652,088

(22) Filed: Oct. 15, 2012

(65) Prior Publication Data

US 2013/0114217 A1 May 9, 2013

(30) Foreign Application Priority Data

Nov. 9, 2011 (JP) ................................. 2011-245111

(51) Int. Cl.
| | |
|---|---|
| H05K 1/00 | (2006.01) |
| H05K 1/18 | (2006.01) |
| H05K 7/00 | (2006.01) |
| H05K 1/14 | (2006.01) |
| H01R 12/52 | (2011.01) |

(52) U.S. Cl.
CPC ............... *H05K 1/144* (2013.01); *H05K 1/181* (2013.01); *H01R 12/52* (2013.01); *H05K 2201/042* (2013.01); *H05K 2201/10303* (2013.01); *H05K 2201/10424* (2013.01); *H05K 2201/2036* (2013.01)
USPC ............ 361/748; 361/760; 361/761; 174/559

(58) Field of Classification Search
USPC ........................... 361/748, 760, 761; 174/559
See application file for complete search history.

(56) References Cited

U.S. PATENT DOCUMENTS

| 7,687,715 B2 | 3/2010 | Sano | |
|---|---|---|---|
| 2010/0101857 A1* | 4/2010 | Miyamoto | .................... 174/559 |

FOREIGN PATENT DOCUMENTS

JP          A-2009-026464          2/2009

* cited by examiner

*Primary Examiner* — Andargie M Aychillhum
(74) *Attorney, Agent, or Firm* — Oliff PLC

(57) ABSTRACT

A printed circuit board laminate is provided of a novel structure that is not only capable of enhancing a degree of freedom in design and achieving a further size reduction, but also capable of enhancing heat releasing performance in a space sandwiched in between two printed circuit boards. A lattice-like portion formed of a plurality of connection walls crossed with one another is provided to an insulating plate interposed between two printed circuit boards, and the connection walls are positioned with clearances from the two printed circuit boards, respectively, by a plurality of supporting ribs protruding from the connection walls toward at least one of the two printed circuit boards.

15 Claims, 5 Drawing Sheets

PRINTED CIRCUIT BOARD LAMINATE

CROSS-REFERENCE TO RELATED APPLICATIONS

This application claims priority to JP 2011-245111, which was filed on Nov. 9, 2011, the entire disclosure of which is hereby incorporated by reference in its entirety.

BACKGROUND

An exemplary implementation of the broad inventive principles relates to a printed circuit board laminate in which two printed circuit boards are laminated one on top of the other and connected to each other with a plurality of board-to-board terminals, and more particularly, to a printed circuit board laminate in which an insulating plate is interposed between two printed circuit boards.

In the prior art, a printed circuit board laminate is described in which a plurality of printed circuit boards are laminated one on top of another as an internal circuit of an electric connection box, such as a junction box, mounted on an automobile. As is described, for example, in JP-A-2009-26464 (Patent Document 1), such a printed circuit board laminate has a structure in which two printed circuit boards are disposed oppositely with a clearance in between and connected to each other by soldering both ends of board-to-board terminals to respective through-holes of these printed circuit boards.

Incidentally, as is described in Patent Document 1, in order to support the printed circuit boards against a push-in force applied to the printed circuit boards when fuses, relays, and the like are connected, the printed circuit board laminate is provided with an insulating plate interposed between the laminated printed circuit boards so that the printed circuit boards are supported on the insulating plate.

SUMMARY

According to the printed circuit board laminate described in Patent Document 1, however, in a case where an electric component, such as a relay, that protrudes considerably from the printed circuit boards is provided between the printed circuit boards, the electric component has to be installed in a location outside the insulating plate. Accordingly, there is not only a problem that a degree of freedom in design is limited, but there is also the problem that a size of the printed circuit boards is increased to secure a region in which to install a large electric component outside the insulating plate. As is disclosed in FIG. 7 of Patent Document 1, it is possible to provide a through-hole to the insulating plate and house an electric component in the through-hole. However, because openings of the through-hole on both sides are closed by the printed circuit boards, there is a problem that heat of the electric component cannot be released effectively.

Also, in contrast to seats supporting a plurality of the board-to-board terminals and made of a high heat-resistance material to prevent deformation due to heat applied when the board-to-board terminals are soldered, the insulating plate is often made of a relatively inexpensive and reasonably low heat-resistance material, to reduce the manufacturing costs. However, the insulating plate is also exposed to soldering heat when board-to-board terminals soldered to one printed circuit board are soldered to the other printed circuit board and therefore may possibly undergo heat deformation.

Patent Document 1: JP-A-2009-26464

Exemplary implementations of the broad inventive principles described herein provide a printed circuit board laminate of a novel structure that is not only capable of enhancing a degree of freedom in design and achieving a further size reduction, but that is also capable of enhancing heat releasing property in a space sandwiched between two printed circuit boards.

Exemplary implementations provide a printed circuit board laminate in which two printed circuit boards are laminated one on top of the other via an insulating plate and connected to each other with a plurality of board-to-board terminals soldered to the respective printed circuit boards, characterized in that the insulating plate is provided with a lattice-like portion formed of a plurality of connection walls crossed with one another and the connection walls are positioned with clearances from the two printed circuit boards by a plurality of supporting ribs protruding from the connection walls toward at least one printed circuit board.

According to exemplary implementations, the lattice-like portion formed of a plurality of the connection walls crossed with one another is provided to the insulating plate installed between the two printed circuit boards. Because of this configuration, it becomes possible to install electric components, such as relays, in spaces defined by the connection walls forming the lattice-like portion. Consequently, it also becomes possible to install the electric components within the insulating plate and a degree of freedom in design of a layout of components can be enhanced. Further, because electric components can be installed within the insulating plate, it is no longer necessary to separately secure a space in which to install the electric components outside the insulating plate. Hence, the printed circuit boards can be smaller in size and it becomes possible to secure an effective space more advantageously on a printed circuit board of the same size.

Also, the connection walls are positioned with clearances from the two printed circuit boards by a plurality of the supporting ribs. Because of this configuration, air is allowed to flow in a space between the connection walls and the printed circuit boards and it becomes possible to enhance heat releasing performance in a space sandwiched between the two printed circuit boards. Consequently, even in a case where electric components are installed in a region surrounded by the connection walls, it becomes possible to effectively release heat of the electric components.

Further, because the insulating plate is of a hollow shape in the lattice-like portion, a material forming the insulating plate can be saved. It thus becomes possible to reduce weight and manufacturing costs of the insulating plate. Also, even in a case where the insulting plate is exposed to heat, for example, when board terminals soldered to one printed circuit board are soldered to the other printed circuit board, it becomes possible to reduce an amount of heat deformation of the insulating plate.

The two printed circuit boards are supported by a plurality of the supporting ribs protruding from the connection walls at positions overlapping the lattice-like portion. Herein, it should be appreciated that the respective supporting ribs may protrude toward only one printed circuit board or may protrude toward both of the printed circuit boards. Also, the number and provided locations of the supporting ribs are set appropriately in consideration of the supporting strength of the printed circuit boards and overlapping on electric components on the printed circuit boards. For example, it may be configured in such a manner that supporting ribs, with each protruding toward both the printed circuit boards, can be provided at two points that are point-symmetrical with respect to a gravity center of the insulating plate. Alternatively supporting ribs can be provided at a plurality of points about the gravity center of the insulating plate, so that both printed circuit boards are supported by two or more supporting ribs spaced apart from each other with the gravity center in between. In addition, for a region where a large load is likely to be applied to the printed circuit board(s), such as a location where a large connector is connected, it is preferable to provide the supporting ribs at shorter intervals than in other regions.

According to exemplary implementations, each of a plurality of the supporting ribs protrudes toward only one of the two printed circuit boards.

Thus, a clearance is formed between the connection walls in portions where the supporting ribs are provided and the printed circuit board on a side opposite to the direction in which the supporting ribs protrude. Because of this configuration, even in a case where the supporting ribs undergo thermal expansion due to soldering heat or the like, the clearance can absorb an amount of thermal expansion of the supporting ribs. Consequently, it becomes possible to avoid the two printed circuit boards from being pushed apart due to thermal expansion of the supporting ribs. Hence, it becomes possible to avoid the occurrence of cracking in soldered portions of the board-to-board terminals caused by a variance of an interval between the printed circuit boards.

According to exemplary implementations, previously described implementations can be configured in such a manner that sectional areas of a plurality of the connection walls are varied.

Thus, it becomes possible to locally change the strength of the connection walls. It thus becomes possible to increase strength in a region where particularly high strength is required, for example, in a region where heat deformation is highly likely to occur, by increasing a sectional area of the connection walls. According to this exemplary implementation, it becomes easier to adjust a sectional area locally than in a case where the insulting plate is formed of a single plate as in the related art because the lattice-like portion is formed of a plurality of the connection walls. Regarding the sectional area of the connection walls, either a height dimension (dimension in a lamination direction of the two printed circuit boards) of the connection walls may be varied or a thickness dimension (dimension in a direction orthogonal to the lamination direction of the two printed circuit boards) may be varied.

According to exemplary implementations, previously described implementations can be configured in such a manner that relays provided to one of the two printed circuit boards are housed in spaces defined by the connection walls of the lattice-like portion.

Thus, because relays that are relatively large components are installed within the insulating plate, it becomes possible to effectively achieve a size reduction of the printed circuit board laminate. Also, it becomes possible to effectively release heat from the relays housed in spaces defined by the connection walls via the clearances between the connection walls and the two printed circuit boards.

According to exemplary implementations, previously described implementations can be configured in such a manner that the insulating plate is integrally provided with seats through, and by which, the board-to-board terminals are inserted and supported.

Thus, the number of components can be reduced because it is no longer necessary to separately prepare seats that support the board-to-board terminals. Further, in a case where there are a plurality of seats, a plurality of the seats can be set to the printed circuit boards at the same time because a plurality of the seats are formed integrally with the insulating plate.

Also, the seats supporting the board-to-board terminals are generally made of a high heat-resistance material to prevent deformation due to soldering heat. According to this aspect, because the seats are integrally provided with the insulating plate, the insulating plate can also be made of a high heat-resistance material. Consequently, even in a case where the insulating plate is exposed to heat, for example, when the board-to-board terminals soldered to one printed circuit board are soldered to the other printed circuit board, it becomes possible to suppress heat deformation of the insulating plate. Also, because the insulating plate is of a hollow shape in the lattice-like portion, an amount of a material necessary for molding can be reduced. Accordingly, even when a relatively expensive material having high heat resistance is used, the insulating plate can be formed without causing a noticeable increase in the material costs.

Exemplary implementations can be configured in such a manner that the insulating plate installed between the two printed circuit boards is provided with the lattice-like portion formed of a plurality of the connection portions crossed with one another and a plurality of the supporting ribs protruding from the connection walls toward at least one printed circuit board for the connection walls to be positioned with clearances from the two printed circuit boards. Because of this configuration, it becomes possible to install electrical components in spaces defined by the connection walls of the lattice-like portion. Thus, not only does it become possible to enhance a degree of freedom in design of the layout of components, but it also becomes possible to reduce the size of the printed circuit board laminate. Further, because heat can be released through the clearances between the connection walls and the two printed circuit boards, it becomes possible to enhance heat releasing performance in a space sandwiched between the two printed circuit boards.

DETAILED DESCRIPTION OF EXEMPLARY IMPLEMENTATIONS

Hereinafter, an exemplary implementation will be described with reference to the drawings.

Figure 1:
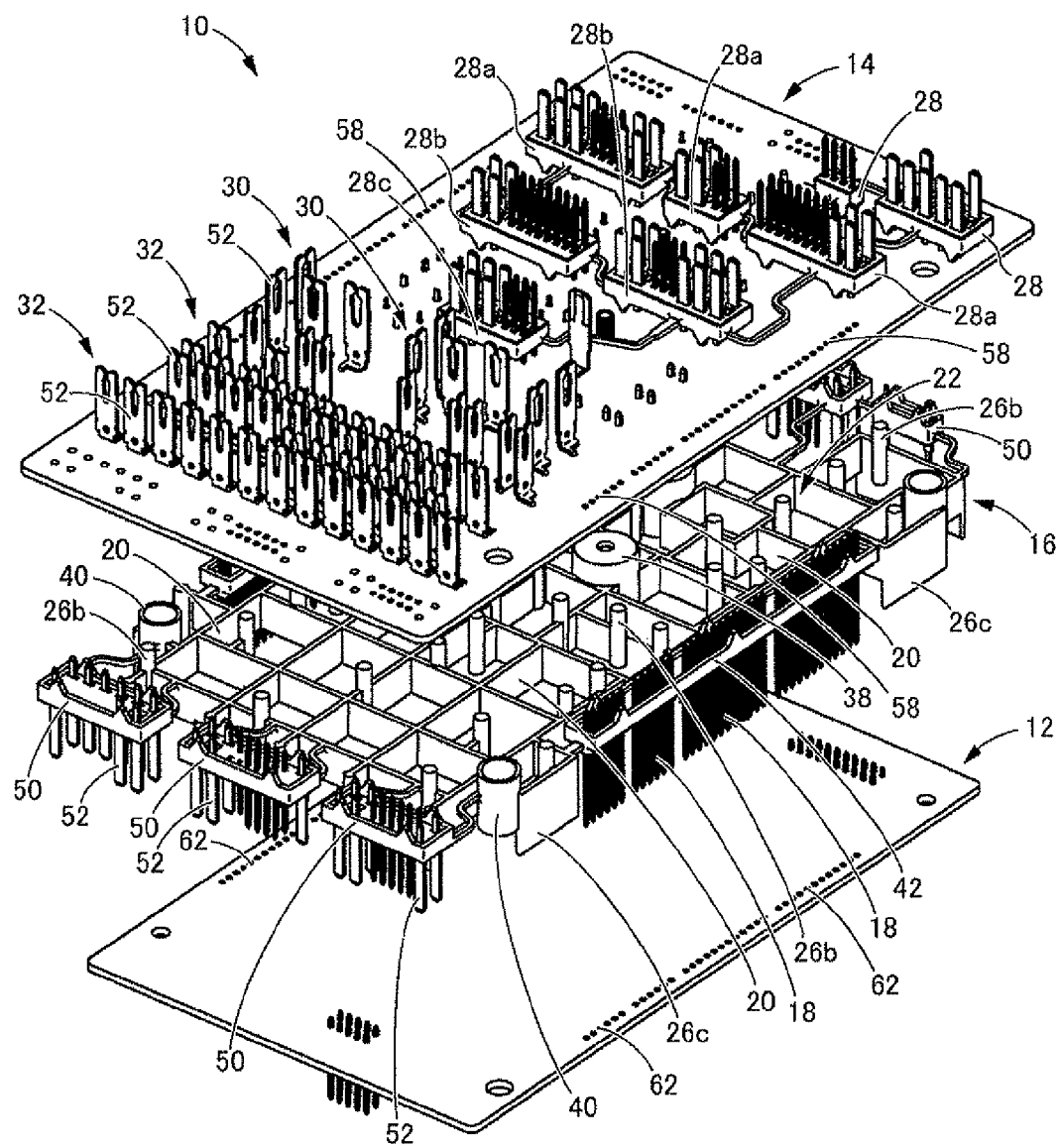
FIG. 1 is an exploded perspective view of a printed circuit board laminate according to one exemplary implementation.

First, FIG. 1 shows a printed circuit board laminate 10 according to one example. The printed circuit board laminate 10 is of a structure in which a first printed circuit board 12 and a second printed circuit board 14 are laminated one on top of the other with an insulating plate 16 in between and connected to each other with a plurality of board-to-board terminals 18.

Figure 2:
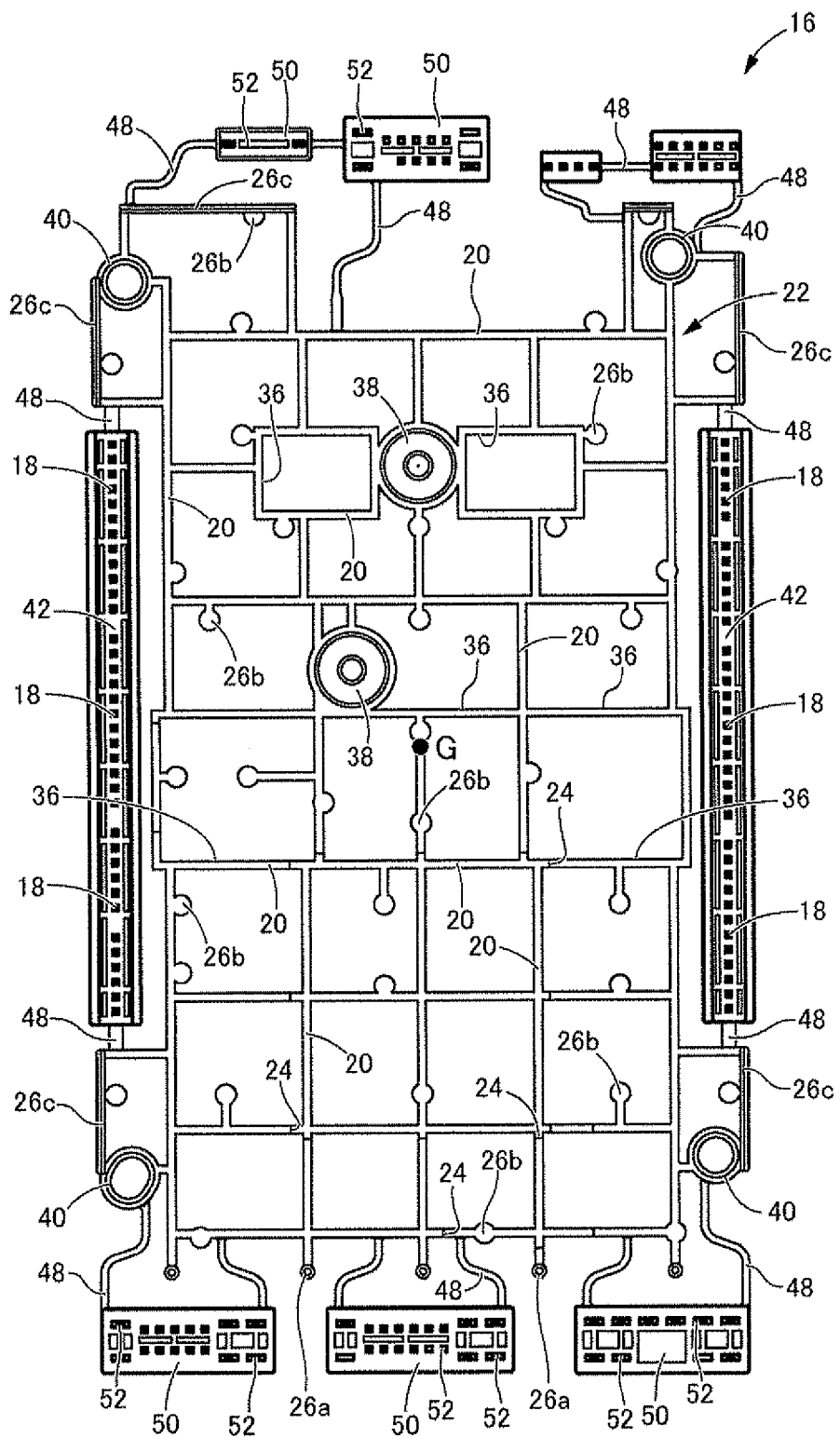
FIG. 2 is a plan view of an insulating plate.
Figure 3:
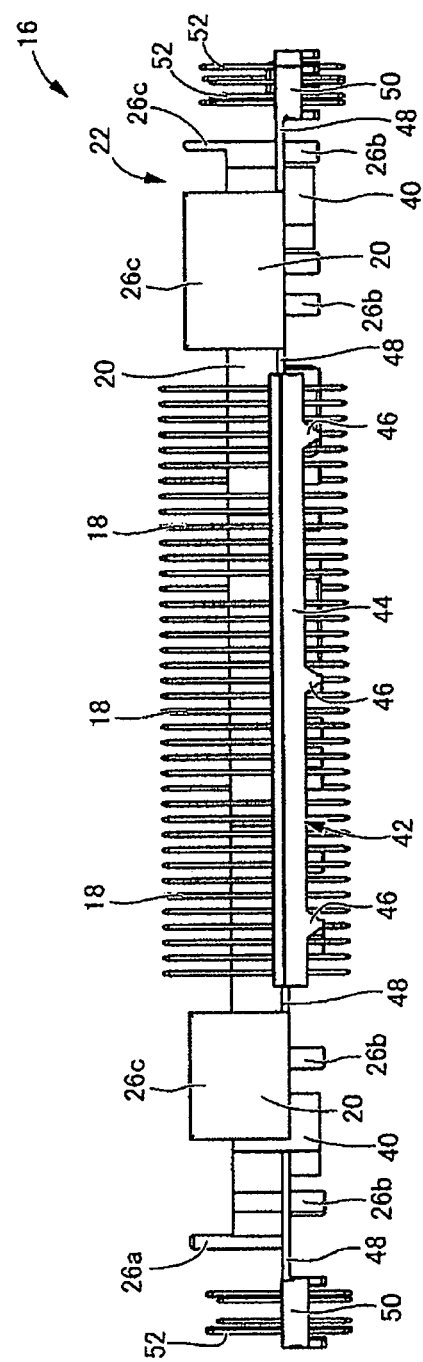
FIG. 3 is a side view of the insulating plate shown in FIG. 2.

FIG. 2 and FIG. 3 show the insulating plate 16. The insulating plate 16 is an integrally-molded article made of non-conductive synthetic resin. Glass-reinforced polybutylene terephthalate (PBT-G) or the like, which have excellent heat resistance, can be adopted as a material forming the insulating plate 16. It should be noted that FIG. 2 and FIG. 3 show the board-to-board terminals 18 and the board terminals 52 described below as well. The insulating plate 16 as a whole is of a longitudinal rectangular shape having a predetermined thickness dimension (dimension in a top-bottom direction of FIG. 3).

The insulating plate 16 is provided with a plurality of connection walls 20 extending in either a lengthwise direction (top-bottom direction of FIG. 2) or a crosswise direction (left-right direction of FIG. 2). A lattice-like portion 22 is formed as a plurality of the connection walls 20 are crossed and connected with one another in the lengthwise and crosswise directions. The respective connection walls 20 have substantially constant width dimensions equal to one another and are of a flat-plate shape linearly extending in the lengthwise direction or the crosswise direction of the insulating plate 16. Herein, a portion that seems to shape a single flat plate in a continuous portion extending on a straight line when viewed in a plane (see FIG. 2) is defined as a single connection wall 20. Further, as is obvious from FIG. 5 described below, each connection wall 20 is provided with a notch 24 opening toward the first printed circuit board 12 as the need arises. By varying a depth dimension of the notches 24, height dimensions (dimensions in a top-bottom direction of FIG. 5) of the connection walls 20 are partially varied. Accordingly, sectional areas of the connection walls 20 are partially varied.

Also, a plurality of the connection walls 20 are provided with a plurality of supporting ribs 26*a*, 26*b*, and 26*c* at appropriate positions. The supporting ribs 26*a* are shaped like a circular column protruding from the connection walls 20 toward the first printed circuit board 12 (upward in FIG. 3). The supporting ribs 26*b* are shaped like a circular column protruding from the connection walls 20 toward the second printed circuit board 14 (downward in FIG. 3). Also, the supporting ribs 26*c* are formed by extending the connection walls 20 toward the first printed circuit board 12 (upward in FIG. 3) and are thereby shaped like a flat plate protruding toward the first printed circuit board 12 along a full length of the connection walls 20.

The number and the provided locations of these supporting ribs 26*a*, 26*b*, and 26*c* are set appropriately in consideration of locations where respective electric components are provided and a manner in which printed wirings are routed in the first printed circuit board 12 and the second printed circuit board 14, required supporting strength, and the like. It is preferable to provide one of the supporting ribs 26*a* or the supporting ribs 26*c* and the supporting ribs 26*b* on one surface of the insulating plate 16 and the other one of the supporting ribs 26*a* or the supporting ribs 26*c* and the supporting ribs 26*b* on the other surface at more than one point about a gravity center of the insulating plate 16, G, so that the first printed circuit board 12 is supported by the supporting ribs 26*a* and the supporting ribs 26*c* at two or more, and more preferably, three or more points about the gravity center of the insulating plate 16, G, and the second printed circuit board 14 is supported by the supporting ribs 26*b* at two or more, and more preferably, three or more points about the gravity center of the insulating plate 16, G.

In this exemplary implementation, in particular, the supporting ribs 26*a*, 26*b*, and 26*c* are provided in locations different from one another and only one of the supporting rib 26*a*, the supporting rib 26*b*, and the supporting rib 26*c* is provided to the connection walls 20 at every point and protrudes toward only one of the first printed circuit board 12 and the second printed circuit board 14. Also, although it is not shown in the drawings, the first printed circuit board 12 of this exemplary implementation is provided with a large number of surface-mounted components in a center portion. Hence, a plurality of the supporting ribs 26*a* are provided side-by-side to only one side of an outermost circumference portion of the lattice-like portion 22 and the supporting ribs 26*c* are provided only to the remaining three sides, so that the supporting ribs 26*a* and 26*c* support only an outer circumference portion of the first printed circuit board 12 without overlapping the center portion of the first printed circuit board 12.

Figure 4:
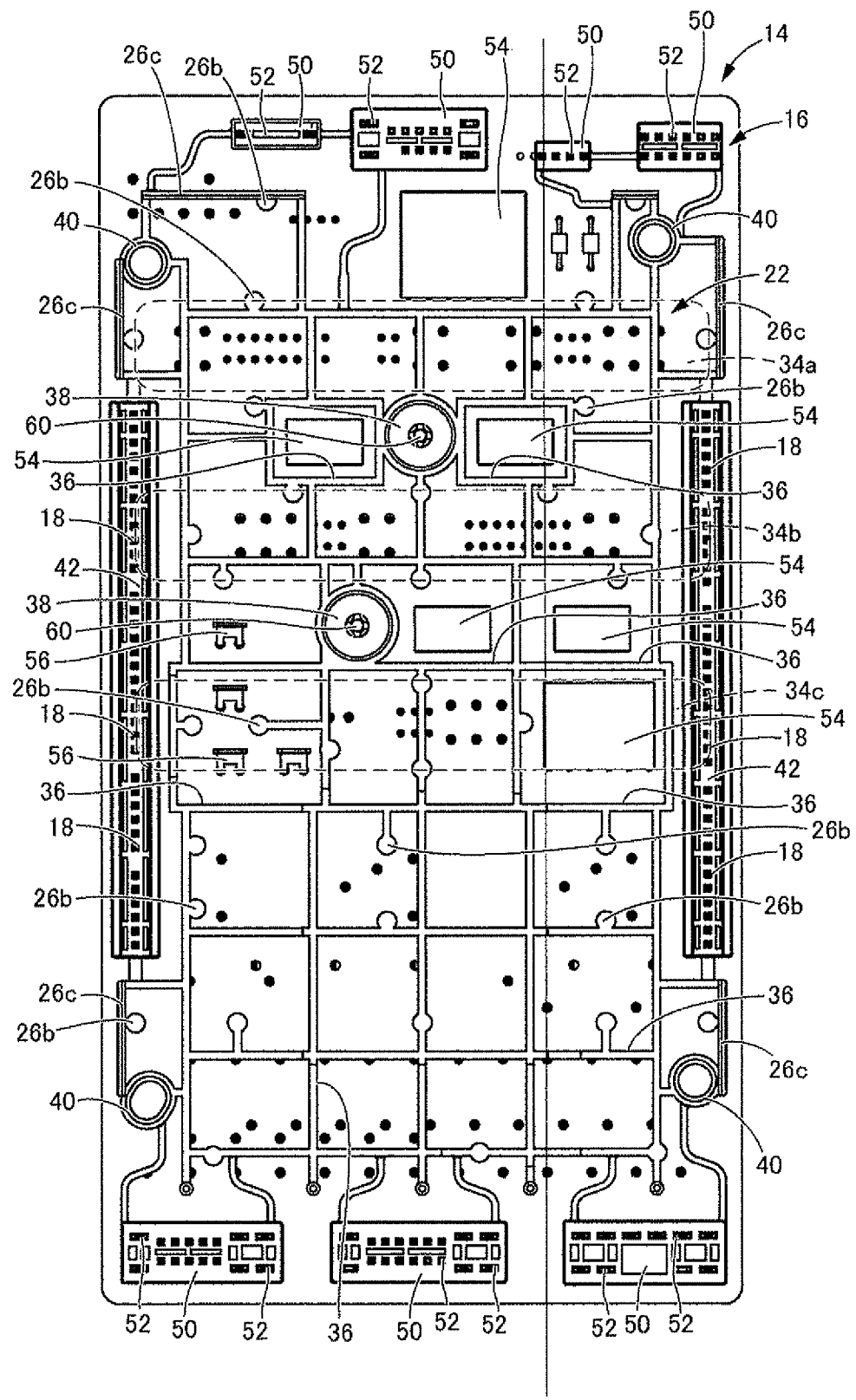
FIG. 4 is a plan view showing the insulating plate shown in FIG. 2 in a state where the insulating plate is placed on top of one printed circuit board.

Meanwhile, as is shown in FIG. 1, the second printed circuit board 14 is provided with a plurality of seat connectors 28 to which unillustrated connecters are connected, a plurality of relay connection portions 30 to which unillustrated relays are connected, fuse connection portions 32 to which unillustrated fuses are connected, and the like. Accordingly, it is preferable to provide the supporting ribs 26*b* in locations in close proximity to the seat connectors 28, the relay connection portions 30, and the fuse connection portions 32, so that a strong supporting force is exerted when connectors, relays, and fuses are connected to these connectors 28 and connection portions 30 and 32. With the second printed circuit board 14 shown in FIG. 1, in particular, large connectors 34*a*, 34*b*, and 34*c* substantially as wide as a full width of the second printed circuit board 14 as is indicted by dotted lines in FIG. 4 are to be connected to three seat connectors 28*a*, two seat connectors 28*b*, and one seat connector 28*c*, respectively, and a large pressing force is applied to the second printed circuit board 14. It is therefore preferable to provide a larger number of the supporting ribs 26*b* in locations in close proximity to these seat connectors 28*a*, 28*b*, and 28*c*.

The lattice-like portion 22 is formed of a plurality of connection walls 20 crossed or connected one another at right angles as above. Accordingly, the lattice-like portion 22 is provided with a plurality of electric component housing portions 36 aligned in a matrix and each surrounded by a plurality of the connection walls 20 on all four sides. Also, because the lattice-like portion 22 is pierced from top to bottom in the respective electric component housing portions 36, the insulating plate 16 is of a hollow shape in the lattice-like portion 22. In this exemplary implementation, in particular, the insulating plate 16 is formed almost entirely of the lattice-like portion 22. Intervals among a plurality of the connection walls 20 are set appropriately in consideration of i) locations where respective electric components are provided and ii) a manner in which printed wirings are routed in the first printed circuit board 12 and the second printed circuit board 14, iii) required support strength, and iv) the like. Also, the lattice-like portion 22 is provided with bolt fixing portions 38 of a bottomed cylindrical shape each bolt fixing portion having a bolt insertion hole. The bolt insertion hole is provided to penetrate through a bottom portion and positioning cylinder portions 40 of a cylindrical shape through which to insert positioning bosses, the positioning bosses being provided to protrude from an unillustrated case of the electric connection box, in appropriate locations as the need arises.

Further, the insulating plate 16 is integrally provided with a plurality of (two in this exemplary implementation) board-to-board terminal seats 42 and 42 as seats. These board-to-board terminal seats 42 and 42 are of substantially the same shape. As is clear from FIG. 3 and the like, as with seats in the related art, each board-to-board terminal seat 42 has a main body portion 44 of a longitudinal block shape and a plurality of (six in this exemplary implementation) leg portions 46 protruding from the main body portion 44 in both end portions and a center portion in a longitudinal direction. The board-to-board terminals 18 are inserted through a plurality of terminal through-holes provided to penetrate through the main body portion 44 one by one in a press-fit state. Accordingly, a plurality of the board-to-board terminals 18 are supported by the board-to-board terminal seats 42. These board-to-board terminal seats 42 are located at both ends of the insulating plate 16 in a width direction by aligning the longitudinal direction of the main body portion 44 in the same direction as the longitudinal direction of the insulating plate 16, and both edge portions of the main body portions 44 in the longitudinal direction are connected to the connection walls 20 with beam-like link portions 48. The board-to-board terminal seats 42 are thus formed integrally with the insulating plate 16.

Also, the insulating plate 16 is integrally provided with a plurality of seats 50. These seats 50 are of substantially the same shape as seats in the related art and each is provided with terminal through-holes penetrating through a main body portion so as to support a plurality of board terminals 52 inserted into the terminal insertion holes in a press-fit state. As with the board-to-board terminal seats 42, the respective seats 50 are connected to the connection walls 20 or an adjacent seat 50 via the beam-like link portion 48. Accordingly, a plurality of the seats 50 are provided to the lattice-like portion 22 on both sides in the longitudinal direction and therefore formed integrally with the insulating plate 16.

Figure 5:
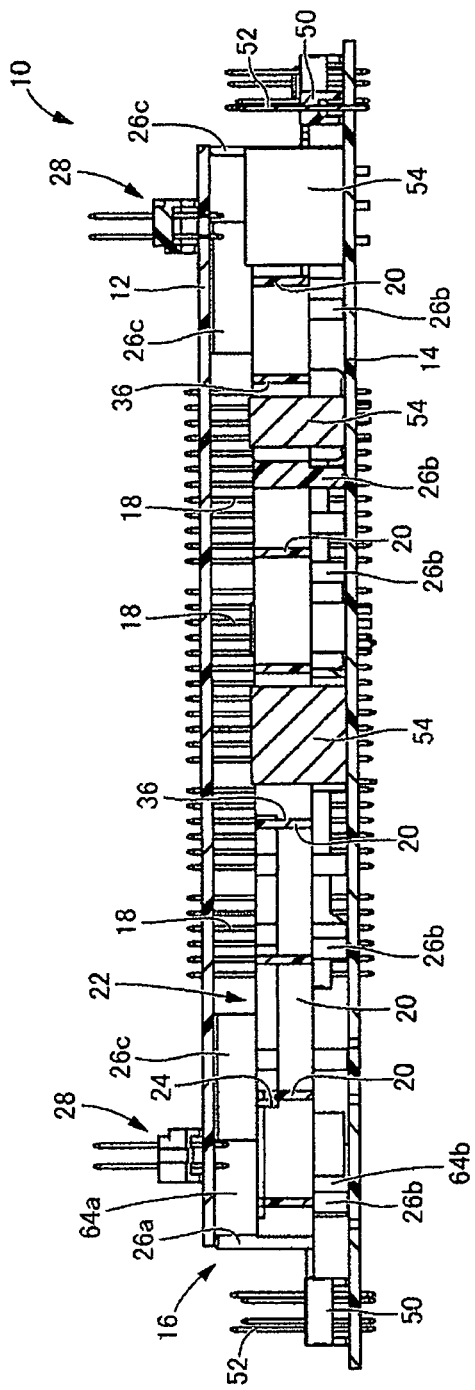
FIG. 5 is a cross section taken on the line V-V of FIG. 4 in a state where the printed circuit board laminate shown in FIG. 1 is assembled.

When the printed circuit board laminate 10 is formed using the insulating plate 16 as above, the board-to-board terminals 18 are inserted through the board-to-board terminal seats 42 and 42 of the insulating plate 16 and the board terminals 52 are inserted through the respective seats 50 of the insulating plate 16 to attach the respective terminals to the insulating plate 16 first. Then, the following are prepared: second printed circuit board 14 preliminarily provided with the seat connectors 28, the board terminals 52 forming the relay connection portions 30 and the fuse connection portions 32, relays 54, short pins 56, and the like. Then, the board-to-board terminals 18 and the board terminals 52 held by the insulating plate 16 are inserted through corresponding through-holes 58 of the second printed circuit board 14 by placing the second printed circuit board 14 on top of the insulating plate 16 and then soldered. As is shown in FIG. 4, the second printed circuit board 14 of this exemplary implementation is bolt-fixed to the insulating plate 16 as bolts 60 inserted through bolt holes (not shown) provided to penetrate through the second printed circuit board 14 are screwed to the bolt fixing portions 38 of the insulating plate 16. Subsequently, as is shown in FIG. 5, the board-to-board terminals 18 are inserted through corresponding through-holes 62 of the first printed circuit board 12 by placing the first printed circuit board 12 preliminarily provided with the seat connectors 28, unillustrated surface-mounted components, and the like, on top of the insulating plate 16 and then soldered. Consequently, the first printed circuit board 12 and the second printed circuit board 14 are connected to each other with a plurality of the board-to-board terminals 18 and the printed circuit board laminate 10 is formed.

As is also shown in FIG. 5, the supporting ribs 26a and 26c of the insulating plate 16 protrude toward the first printed circuit board 12 and are provided in locations overlapping the outer circumference portion of the first printed circuit board 12. Accordingly, the supporting ribs 26a and 26e are in contact with the first printed circuit board 12 and the connection walls 20 are positioned with a clearance 64a from the first printed circuit board 12. Meanwhile, the supporting ribs 26b protrude toward the second printed circuit board 14 and the supporting ribs 26b are interposed between the connection walls 20 and the second printed circuit board 14. Accordingly, the connection walls 20 are positioned with a clearance 64b from the second printed circuit board 14. By placing the insulating plate 16 on top of the second printed circuit board 14, the relays 54 and the short pins 56 provided to the second printed circuit board 14 are housed within the electric component housing portions 36 of the lattice-like portion 22.

The printed circuit board laminate 10 having the structure as described above is housed in a case of an electric connection box for automobile, such as a junction box, and forms an internal circuit of the electric connection box. In a case where a pressing force toward the insulating plate 16 is applied to the first printed circuit board 12 as an unillustrated connector is connected to the seat connector 28 of the first printed circuit board 12, the supporting ribs 26a and 26c of the insulting plate 16 support the first printed circuit board 12 in cooperation. Meanwhile, in a case where a pressing force toward the insulating plate 16 is applied to the second printed circuit board 14 as unillustrated connectors, relays, and fuses are connected to the seat connectors 28, the relay connection portions 30, and the fuse connection portions 32, respectively, of the second printed circuit board 14 (see FIG. 1), the supporting ribs 26b of the insulating plate 16 support the second printed circuit board 14. Consequently, it becomes possible to suppress damage on the first printed circuit board 12 and the second printed circuit board 14 and the occurrence of cracking in soldered portions of the board-to-board terminals 18 by suppressing deformation of the first printed circuit board 12 and the second printed circuit board 14 accompanying connections of the electric components.

According to the printed circuit board laminate 10 having the structure as above, it is possible to house electric components, such as the relays 54 and the short pins 56, in the electric component housing portions 36 of the lattice-like portion 22 of the insulating plate 16. It thus becomes possible to provide electric components, such as the relays 54 and the short pins 56, that protrude considerably from the second printed circuit board 14 within the insulating plate 16. Hence, a layout of the components can be enhanced. Also, because the relays 54 and the like can be installed within the insulating plate 16, it is no longer necessary to secure a region in which to install the relays 54 and the like in the second printed circuit board 14 outside the insulating plate 16. It thus becomes possible to reduce the size of the second printed circuit board 14 and hence the printed circuit board laminate 10. Also, in a case where the size of the second printed circuit board 14 is not changed, by installing the relays 54 and the like within the insulating plate 16, a larger effective area can be secured in the boards. In particular, by installing the relays 54 that are electric components occupying a large area on the printed circuit board within the insulating plate 16, it becomes possible to enhance space utilization markedly. Also, because a degree of freedom in layout of the relays 54 and the like is increased, it becomes possible to shorten a length of the printed wirings connected to the relays 54 and the like. The manufacturing costs can therefore be reduced.

Also, the connection walls 20 forming the lattice-like portion 22 are positioned with the clearances 64a and 64b from both of the first printed circuit board 12 and the second printed circuit board 14, respectively. Accordingly, fluidity of air is ensured through the clearances 64a and 64b and even when the relays 54 and the like are installed in the electric component housing portions 36 surrounded by the connection walls 20, it becomes possible to effectively release heat of the relays 54 and the like.

Further, the insulating plate 16 is of a hollow shape piercing from top to bottom in the lattice-like portion 22. Consequently, a material forming the insulating plate 16 can be saved and it becomes possible to reduce the weight and the manufacturing costs of the insulating plate 16. Also, by partially adjusting the size of the sectional area of the connection walls 20 in the lattice-like portion 22, it becomes possible to partially adjust strength of the insulating plate 16 by increasing a sectional area of the connection walls 20 where higher strength is required. Also, because the lattice-like portion 22 is formed of a plurality of the plate-shaped connection walls 20, it becomes easier to adjust a sectional areal locally than in a case where the insulating plate as a whole is formed in a plate shape.

In addition, because the connection walls 20 are supported by the supporting ribs 26a through 26c, the connection walls 20 are positioned with the clearances 64a and 64b from both of the first printed circuit board 12 and the second printed circuit board 14, respectively. Accordingly, even in a case where the connection walls 20 undergo thermal expansion due to soldering heat, it becomes possible to prevent the connection walls 20 from spreading a space between the first printed circuit board 12 and the second printed circuit board 14. It thus becomes possible to lower a possibility that cracking occurs in the soldered portions of the board-to-board terminals 18 soldered to both the printed circuit boards 12 and 14. Further, in this exemplary implementation, only either one of the supporting rib 26a or 26c and the supporting rib 26b is provided to the lattice-like portion 22 at every point and the supporting ribs 26 protrude toward only one of the first printed circuit board 12 and the second printed circuit board 14. The supporting ribs 26 are therefore positioned with a clearance from either one of the first printed circuit board 12 and the second printed circuit board 14. Hence, even in a case where a length dimension of the supporting ribs 26 increases due to thermal expansion or the like, the clearance can absorb an increase in length dimension of the supporting ribs 26. This configuration therefore lowers a possibility that a spacing distance between the first printed circuit board 12 and the second printed circuit board 14 is varied.

Further, the insulating plate 16 is integrally provided with a plurality of board-to-board terminal seats 42 and seats 50. The number of components can therefore be reduced. Also, by placing the insulating plate 16 on top of the second printed circuit board 14 by inserting the board-to-board terminals 18 through the board-to-board terminal seats 42 and also by inserting the board terminals 52 through the seats 50, it becomes possible to insert a plurality of the board-to-board terminals 18 and the board terminals 52 through the corresponding through-holes 58 at the same time. It thus becomes possible to enhance manufacturing efficiency of the printed circuit board laminate 10. Further, because the board-to-board terminal seats 42 and the seats 50 are formed integrally with the insulating plate 16, it becomes possible to form the insulating plate 16 from the same high heat-resistance material as the material of the seats 42 and 50. Consequently, even in a case where the insulating plate 16 is exposed to soldering heat, for example, when the board-to-board terminals 18 are first soldered to the second printed circuit board 14 and then to the first printed circuit board 12, it becomes possible to suppress heat deformation of the insulating plate 16.

While one exemplary implementation has been described in detail, it should be appreciated that the invention is not limited to the specific description above. For example, the lattice-like portion is provided to substantially the entire insulating plate in the exemplary implementation above, but the lattice-like portion may be formed in a part of an insulating plate of a flat-plate shape as in the related art.

Further, seats supporting the board-to-board terminals and seats supporting the board terminals are not necessarily formed integrally with the insulating plate. Also, various shapes can be adopted for a sectional shape of the supporting ribs and the supporting ribs may have a rectangular sectional shape or a polygonal sectional shape, such as a hexagonal sectional shape. Furthermore, the supporting ribs may protrude toward both of the two printed circuit boards. All the supporting ribs provided to the insulating plate may protrude toward both of the two printed circuit boards or the supporting ribs protruding toward both of the printed circuit boards and the supporting ribs protruding toward only one of the two printed circuit boards as in the exemplary implementation above may be used in combination.

What is claimed is:

1. a printed circuit board laminate comprising:
    two printed circuit boards;
    an insulating plate that laminates the two printed circuit boards one on top of the other, the insulating plate being provided with a lattice-like portion formed of a plurality of connection walls crossed with one another, the connection walls being positioned with clearances from the two printed circuit boards by a plurality of supporting ribs protruding from the connection walls toward at least one of the two printed circuit board, the connection walls being formed with the supporting ribs as a unitary structure; and a plurality of board-to-board terminals soldered to the respective printed circuit boards, the board-to-board terminals connecting the two printed circuit boards.

2. The printed circuit board laminate according to claim 1, wherein:
    each of the supporting ribs protrudes toward only one of the two printed circuit boards.

3. The printed circuit board laminate according to claim 2, wherein:
    sectional areas of the connection walls are varied.

4. The printed circuit board laminate according to claim 2, wherein:
    relays provided to one of the two printed circuit boards are housed in spaces defined by the connection walls of the lattice-like portion.

5. The printed circuit board laminate according to claim 2, wherein:
    the insulating plate is integrally provided with seats through which and by which the board-to-board terminals are inserted and supported.

6. The printed circuit board laminate according to claim 1, wherein:
    sectional areas of the connection walls are varied.

7. The printed circuit board laminate according to claim 6, wherein:
    the sectional areas of a plurality of the connection walls are varied.

8. The printed circuit board laminate according to claim 7, wherein:
    the insulating plate is integrally provided with seats through which and by which the board-to-board terminals are inserted and supported.

9. The printed circuit board laminate according to claim 6, wherein:
    relays provided to one of the two printed circuit boards are housed in spaces defined by the connection walls of the lattice-like portion.

10. The printed circuit board laminate according to claim 6, wherein:
    the insulating plate is integrally provided with seats through which and by which the board-to-board terminals are inserted and supported.

11. The printed circuit board laminate according to claim 1, wherein:
  relays provided to one of the two printed circuit boards are housed in spaces defined by the connection walls of the lattice-like portion.

12. The printed circuit board laminate according to claim 11, wherein the spaces are formed such that the relays are disposed inward of outermost connection walls of the insulating plate.

13. The printed circuit board laminate according to claim 1, wherein:
  the insulating plate is integrally provided with seats through which and by which the board-to-board terminals are inserted and supported.

14. The printed circuit board laminate according to claim 1, wherein the supporting ribs protrude from the connection walls in at least two distinct directions.

15. The printed circuit board laminate according to claim 1, wherein the supporting ribs are disposed entirely inward of the two printed circuit boards with respect to a stacking direction of the two printed circuit boards and the insulating plate.

* * * * *